(12) United States Patent
Geusic et al.

(10) Patent No.: US 7,084,067 B2
(45) Date of Patent: Aug. 1, 2006

(54) REMOVAL OF COPPER OXIDES FROM INTEGRATED INTERCONNECTS

(75) Inventors: Joseph E. Geusic, Berkeley Heights, NJ (US); Alan R. Reinberg, Westport, CT (US)

(73) Assignee: Micron Technology, Inc., Boise, ID (US)

( * ) Notice: Subject to any disclaimer, the term of this patent is extended or adjusted under 35 U.S.C. 154(b) by 375 days.

(21) Appl. No.: 10/404,396

(22) Filed: Mar. 31, 2003

(65) Prior Publication Data

US 2003/0203630 A1 Oct. 30, 2003

Related U.S. Application Data

(60) Continuation of application No. 09/888,845, filed on Jun. 25, 2001, now Pat. No. 6,579,803, which is a division of application No. 09/484,683, filed on Jan. 17, 2000, now Pat. No. 6,348,125.

(51) Int. Cl.
*H01L 21/302* (2006.01)

(52) U.S. Cl. .............. 438/708; 438/706; 438/709; 216/66

(58) Field of Classification Search ............... 438/706, 438/710, 712, 708, 709; 216/62, 65; 134/1.1, 134/1.2
See application file for complete search history.

(56) References Cited

U.S. PATENT DOCUMENTS

| 4,151,008 | A | * | 4/1979 | Kirkpatrick ............... 438/799 |
| 4,871,416 | A | | 10/1989 | Fukuda et al. |
| 5,534,312 | A | * | 7/1996 | Hill et al. ............... 427/533 |
| 5,686,789 | A | | 11/1997 | Schoenbach et al. |
| 5,736,002 | A | | 4/1998 | Allen et al. |
| 5,782,986 | A | * | 7/1998 | Butterbaugh et al. ...... 134/1.3 |
| 6,194,833 | B1 | * | 2/2001 | DeTemple et al. .......... 313/631 |
| 6,214,707 | B1 | * | 4/2001 | Thakur et al. ............. 438/513 |
| 6,284,050 | B1 | * | 9/2001 | Shi et al. ............... 118/715 |
| 6,326,301 | B1 | | 12/2001 | Venkatesan et al. |

FOREIGN PATENT DOCUMENTS

WO    WO 98/53480    11/1998

OTHER PUBLICATIONS

El-Habachi et al., "Emission of excimer radiation from direct current, high pressure, hollow cathode discharges," Appl. Phys. Lett. vol. 72, No. 1, Jan. 5, 1998, p. 22-24.

(Continued)

*Primary Examiner*—Lan Vinh
(74) *Attorney, Agent, or Firm*—Knobbe, Martens, Olson & Bear, LLP

(57) ABSTRACT

An apparatus and a method for photoreducing copper oxide layers from semiconductor wafers during the processes of forming interconnects in advanced IC manufacturing. The apparatus comprises a reaction chamber with a high intensity UV light source and a wafer holder in the chamber. The UV light source is made of arrays of microdischarge devices fabricated on a semiconductor wafer where each of the microdischarge devices has the structure of a hollow cathode. Multiple arrays of microdischarge devices can be assembled together to make a planar UV lamp so as to provide a sufficient area for the UV illumination. The wafer holder in the chamber is made rotatable for a better uniformity during the photoreduction process. A non-oxidizing gas is flowed into the chamber to prevent instant and subsequent oxidation on the copper surface.

16 Claims, 6 Drawing Sheets

OTHER PUBLICATIONS

El-Habachi et al., "Generation of intense excimer radiation from high-pressure hollow cathode discharges," Appl. Phys. Lett., vol. 73, No. 7, Aug. 17, 1998, p. 885-887.

Fleisch et al., "An XPS Study of the UV Photoreduction of Transistion and Noble Metal Oxides," Applied Surface Science, vol. 26, 1986, p. 488-497.

Fleisch et al., "Reduction of Copper Oxides By UV Radiation And Atomic Hydrogen Studied By XPS," (Abstract) Application of Surface Science, vol. 10, No. 1, Jan.-Feb. 1982, p. 51-62.

Frame et al., "Microdischarge devices fabricated in silicon," Appl. Phys. Lett., vol. 71, No. 9, Sep. 1, 1997, p. 1165-1167.

Kogelshatz et al., "Silent-discharge driven excimer UV sources and their application," Appl. Surf. Sci., vol. 54, 1992, p. 410-497.

Ryan et al., "Copper interconnects for advanced logic and DRAM," IEDM Digest, 1998, p. 258-259.

Schoenbach et al., "Microhollow cathode discharges," Appl. Phys. Lett. vol. 68, No. 1 Jan. 1, 1996, p. 13-15.

Zhang et al., "Efficient excimer ultraviote sources from a dielectric barrier discharge in rare-gas/halogen mixtures," J. Appl. Phys. vol. 80, Issue 2, Jul. 15, 1996, pp. 633-638.

* cited by examiner

| OXIDE | BAND GAP (eV) | BAND GAP (KJ/mol) | $\Delta H_1$ (KJ/mol) | REDUCTION |
|---|---|---|---|---|
| $MoO_3$ | 2.9 | 284 | 746 | NO |
| $MoO_2$ | | | 156 | YES |
| $WoO_3$ | 2.8 | 270 | 842 | NO |
| $WoO_2$ | | | 254 | YES |
| CuO | 2.6 | 257 | 168 | YES |
| $CuO_2$ | 1.9 | 188 | 157 | YES |
| $V_2O_5$ | 2.3 | 221 | 1550 | NO |
| ZuO | 3.2 | 310 | 645 | NO |
| PdO | 1.5 | 144 | 85 | YES |
| PtO | – | – | – | YES |

REMOVAL OF COPPER OXIDES FROM INTEGRATED INTERCONNECTS

REFERENCE TO RELATED APPLICATION

This application is a continuation of U.S. application Ser. No. 09/888,845, filed Jun. 25, 2001, now U.S. Pat. No. 6,579,803 which is a divisional of U.S. application Ser. No. 09/484,683, filed Jan. 17, 2000, now U.S. Pat. No. 6,348,125.

BACKGROUND OF THE INVENTION

1. Field of the Invention

The present invention relates to manufacturing of integrated circuits. In particular, this invention relates to the removal of copper oxides from integrated interconnects by utilizing a high intensity UV light source.

2. Description of the Related Art

Copper thin films are currently being used as interconnection materials in semiconductor manufacturing. As compared to aluminum, a traditionally used material, copper has more advantages which are critical for improving integrated circuit performance. First, copper has a much lower sheet resistivity than aluminum. Thus, for carrying the same amount of current flow, a copper line can be made narrower and thinner than a line made of aluminum. Using copper, then, allows for a higher integration density. Also, narrower and thinner conductive lines decrease the inter-level and inter-line capacitance, which leads to a higher speed and less cross-talk for the circuit. Moreover, copper has a better electromigration resistance than aluminum. Therefore, as metal lines are made thinner and circuitry becomes more densely packed, copper provides higher reliability when used in integrated circuits.

Typically, several interconnect levels are employed in an integrated circuit. Low contact resistance, also known as via resistance, to and between interconnection levels is required.

However, during fabrication processes, a copper surface readily oxidizes even in the air, forming copper oxides, such us $Cu_2O$ and $CuO$. These oxides form a high resistance layer between two interlevel copper lines, which, as known by those skilled in the art, would slow down the circuit significantly.

It is necessary to remove the insulating oxide layer from the copper surface before making a connection with a subsequent copper layer.

SUMMARY OF THE INVENTION

It is thus an objective of the present invention to provide a device which can be used to efficiently remove oxides from a copper surface. It is another objective of the present invention to provide a copper oxide removal process by using the device, and integrating the process into manufacturing of interconnect levels.

In accordance with one aspect of the present invention, the device for removing copper oxide is a semiconductor reaction chamber which comprises a high intensity UV light source, a means for holding one or more semiconductor wafers inside the chamber, and a means for providing a non-oxidation environment in the chamber.

The high intensity UV light source is made of at least one array of high pressure, hollow cathode microdischarge devices which are fabricated on a semiconductor wafer. The UV light source radiates light with a wavelength preferably lower than 468 nm, to photoreduce the copper oxide on the semiconductor wafer. The total area of the light source is preferably larger than the wafer area being processed.

The reaction chamber can be made either as a single wafer or a multiple wafer chamber. The wafer holding means is preferably a moving part, so that the copper oxides can be uniformly photoreduced across the wafer or wafers.

In order to prevent the copper surface from further oxidation, a non-oxidizing environment is obtained by flowing a non-oxidizing gas during the photoreduction process. The gas can be selected from hydrogen, ammonia, nitrogen, neon, or other non-oxidizing gases.

BRIEF DESCRIPTION OF THE DRAWINGS

The present invention may be best understood through the following description with reference to the accompanying drawings, in which.

DETAILED DESCRIPTION OF THE INVENTION

In accordance with the principles of the present invention, an apparatus and a method of photoreducing copper oxides from a semiconductor wafer for improving inter-layer contact conductivity will be described in detail as follows.

A study of UV photoreduction of transition and noble metal oxides was reported by T. H. Fleisch et al in *Applied Surface Science* 26 (1986) 488–497, in which a simple model was developed to account for the metal oxides that could and could not photoreduce. It showed that when the band gap of the metal oxide is greater than the enthalpy of formation of the metal oxide, photoreduction to the metal can be achieved by illuminating the metal oxide with radiation having energy greater than the band gap.

Figures 1, 2:
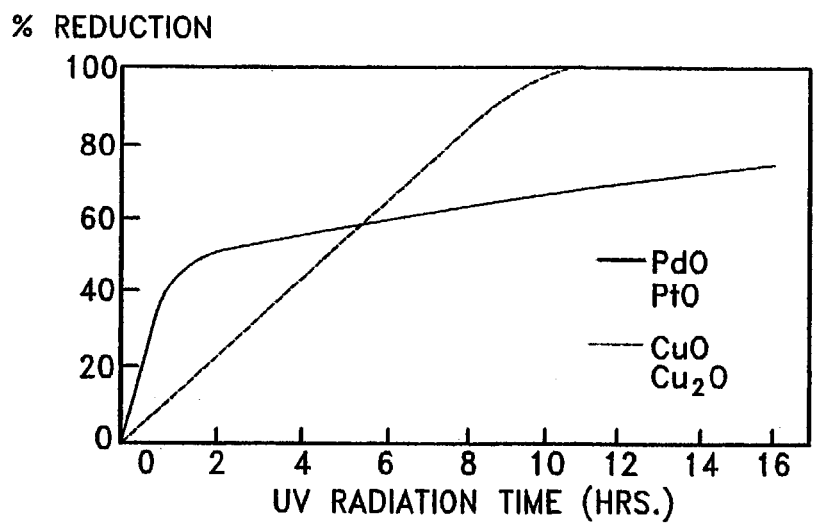
FIG. 1 is a table from the study of Fleisch et al, listing eight metal oxides and whether they can be UV photo reduced.
FIG. 2 shows a chart also from the study of Fleisch et al, which displays oxide reduction as a function of UV radiation time by comparing copper oxides with the other metal oxide.

With reference to FIG. 1, a table, which is from the study of Fleisch et al, illustrates eight different metal oxides with their band gap and enthalpy of formation. As shown in the table, the band gaps of $Cu_2O$ and $CuO$ are 1.9 eV, which is equivalent to 188 kJ/mol, and 2.6 eV, which is equivalent to 257 kJ/mol, respectively. Since the corresponding enthalpies of formation for $Cu_2O$ and $CuO$ are 157 kJ/mol and 168 kJ/mol respectively, direct photoreduction from $Cu_2O$ and $CuO$ to metallic copper is expected because the band gap of each oxide exceeds the corresponding enthalpies of formation.

Basically, in order to photoreduce both of the copper oxides, the energy provided by the illuminating light has to be larger than the band gap of CuO, which is 2.6 eV. With a simple calculation, $E=h\nu=hc/\lambda$, where E is the energy needed for overcoming the band gap, h is Plank's constant, c is the speed of light, and $\lambda$ is the wavelength of the illuminating light, one can find that the wavelength of the illuminating light has to be shorter than 468 nm in order to have photoreduction for copper oxide. In reality, for an efficient photoreduction process, a UV light with a wavelength from 100 nm to 400 nm is desired.

Referring to FIG. 2 as reported by Fleisch et al, this chart illustrates the reduction percentage of two types of metal oxides as a function of UV radiation time under low intensity UV radiation, showing that under the same condition, the UV photoreduction process favors copper oxide reduction over the other metal oxide.

Figure 3:
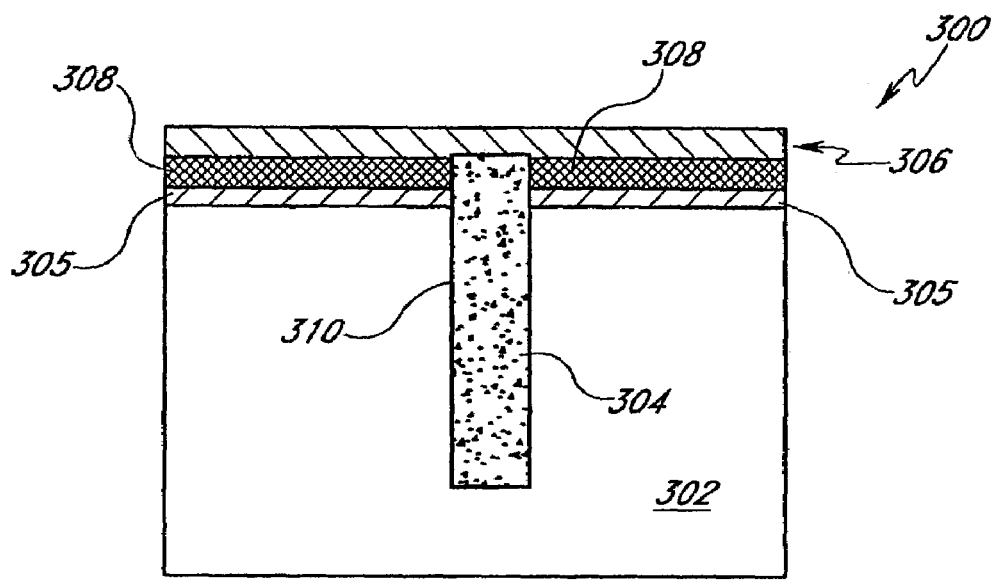
FIG. 3 illustrates a cross section of a single microdischarge device in silicon from the study of J. W. Frame et al.

In recent studies, a new type of high intensity UV light source, or a UV lamp, has been reported by El-Hibachi and Schoenbach in *Appl. Phys. Lett.*, Vol. 73, No. 7, 17 Aug. 1998. This UV light source is a microdischarge device, as shown in FIG. 3, with the structure of a hollow cathode filled with Xenon gas, where each hollow cathode has a diameter of 100 μm. The wavelength of radiant UV light from Xenon gas is 172 nm. The microdischarge device can be fabricated on a silicon wafer, as described in J. W. Frame D. J. Wheeler, T. A. Detemple and J. G. Eden, *Appl. Phys. Lett,* 71(9), September 1997, by forming the hollow cathode 310 in a silicon substrate 302 and forming an anode 308 on top of the hollow cathode, where the anode 308 is made of a good conductor such as a metal or heavily n-doped polysilicon, coated on a dielectric glass 305, such as silicon dioxide, and where the anode material and dielectric are patterned to have a hole with a diameter equal to the diameter of the hollow cathode. A UV transparent glass plate, such as silicon dioxide, 306 is formed on top of the anode material serving as a window to allow the light to pass through and a means of containing the discharge gas 304. The hollow cathode structure is formed with micromachining technology, and the discharge filler 304, such as Xenon or other gases, can be sealed inside. An intensity from a single hollow cathode of 65 W/cm² has been reported and it is concluded that arrays of these discharge devices can be formed to realize a flat panel UV lamp with a radiant intensity exceeding 50 W/cm².

Detailed fabrication processes in making arrays of microdischarge devices on a silicon wafer are disclosed in a patent application PCT/US98/09915 by Detemple et al, which is incorporated here by reference.

Figure 4:
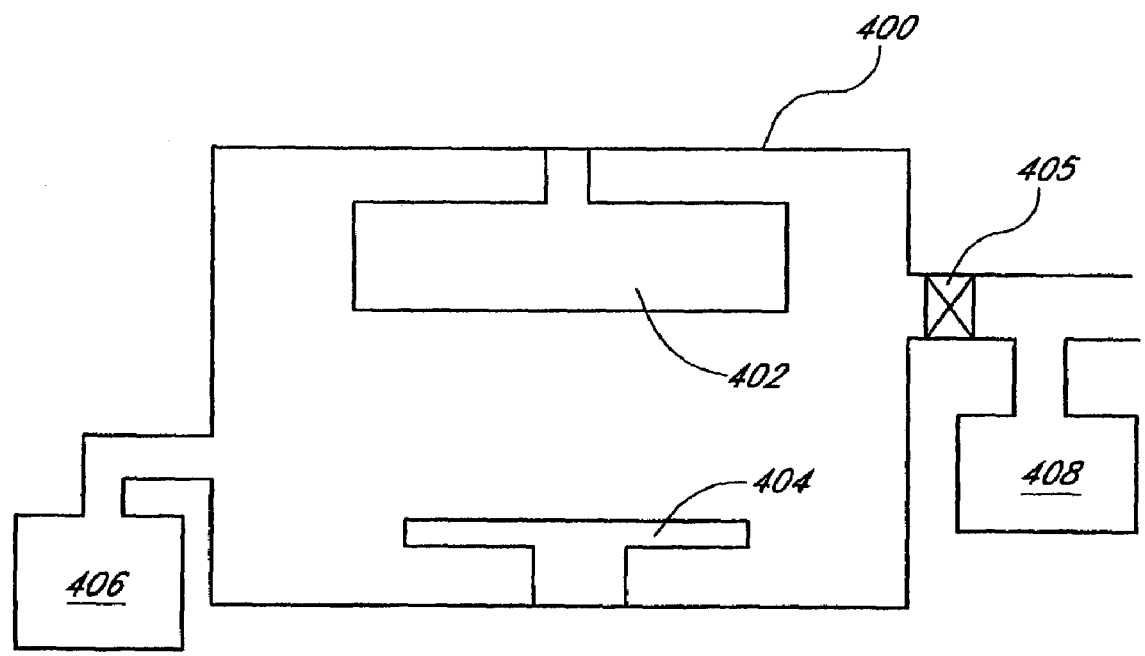
FIG. 4 illustrates the reaction chamber of the present invention for photoreducing copper oxides from a semiconductor wafer.

In accordance with one aspect of the present invention, an apparatus, or a device, is disclosed herein for photoreducing copper oxides from a copper surface on a semiconductor wafer by utilizing a high intensity UV light source, where the UV light source is made of an array or arrays of microdischarge devices. Referring to FIG. 4, the apparatus for photoreducing copper oxide is a reaction chamber 400. A planar high intensity UV light source 402 and a wafer holder 404 are mounted inside the chamber 400, where the surface of the wafer holder 404 is preferably parallel with and facing the planar light source. During the photoreduction process, a semiconductor wafer (not shown) having a copper oxide layer thereon is placed on the wafer holder 404, receiving the illuminating UV light from the light source so as to photoreduce the copper oxide layer.

The reaction chamber 400 further comprises a gas supply 406 for providing a non-oxidizing gas flow into the chamber 400 to prevent instant oxidation on the copper surface. Accordingly, a gas pump 408 is also connected to the chamber for expelling oxygen at the beginning of the process, as well as for exhausting the used gases during the process.

An array of microdischarge devices 502 is fabricated on a silicon wafer using IC and micromachining technologies. Two embodiments of such an array 502 are illustrated in FIG. 5a and FIG. 5b.

Figure 5A:
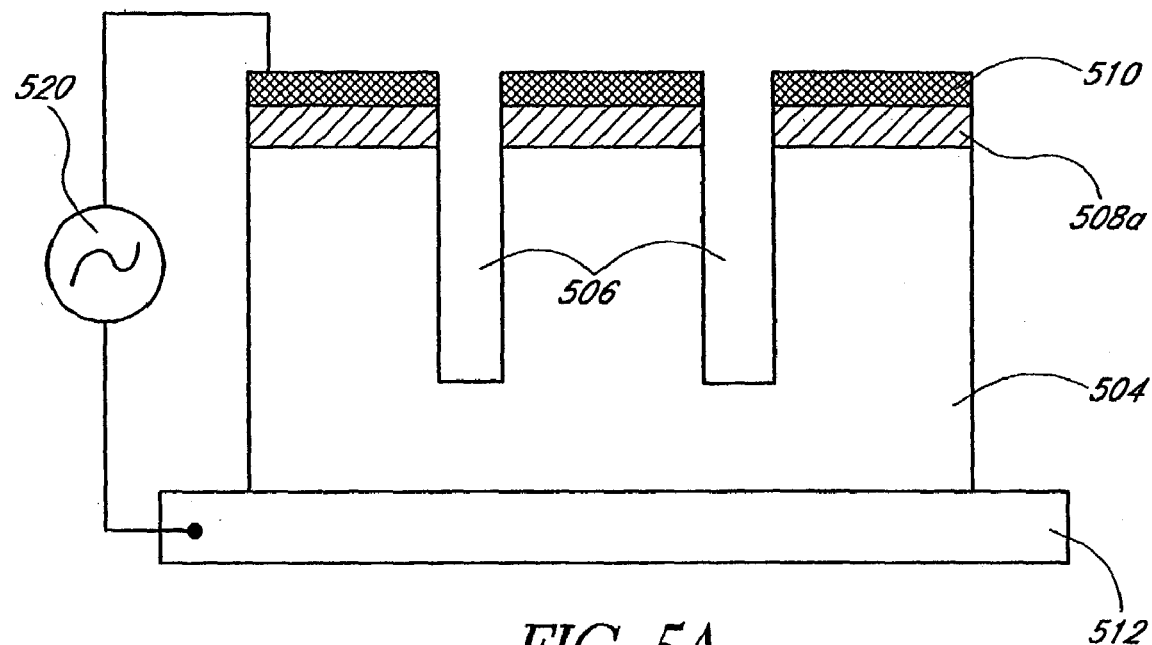
FIG. 5a shows a cross section of one embodiment illustrating an array of microdischarge devices fabricated on a silicon wafer.

The first embodiment of an array of microdischarge devices 502 as illustrated in FIG. 5a has the features where each microdischarge device has a hollow cathode structure, where an elongated hollow cavity or microcavity 506 is formed by etching into the semiconductor substrate 504. Before forming the hollow cavity 506, a layer of insulating material 508a, such as silicon dioxide, and a layer of conductive material 510, such as aluminum or n-doped poly silicon, are deposited on top of the silicon substrate, forming a stack. A photolithography step and an etching process can then be made on the stack together with the step of forming the hollow cavity 506 in the substrate 504. The substrate 504 itself is a conductive material which is preferably made of n-doped silicon or n-doped poly silicon. The substrate where the hollow cavity is formed therein functions as a cathode during the microdischarge process. A conductive supporting element 512 can also be used at the back of the substrate 504, making electrical connections from the cathode or the substrate 504 to the negative side of a power supply 520. The positive side of the power supply 520 is connected to the conductive layer 510 which functions as the anode during the above-mentioned microdischarge process. Alternating applied voltage can also be used.

Figure 5B:
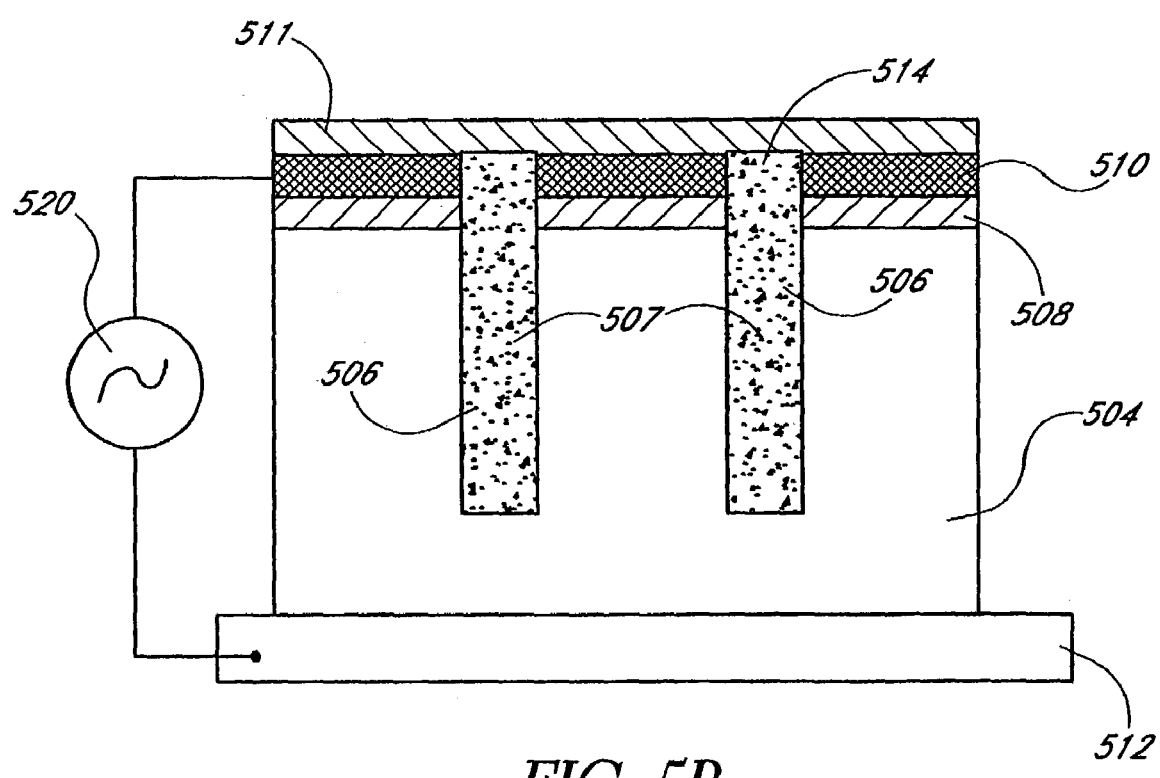
FIG. 5b shows a cross section of another embodiment illustrating an array of microdischarge devices fabricated on a silicon wafer.

The second embodiment of an array of microdischarge devices 502 is shown in FIG. 5b. In this embodiment, each microdischarge device has a similar hollow cavity structure as in the first embodiment, where an elongated cavity 506 is formed by etching into the semiconductor substrate 504. A conductive layer 510, preferably aluminum or n-doped poly silicon, is formed on top of a layer of dielectric film 508, with openings made in both of the films, 508 and 510, to expose the area of each hollow cathode. This conductive layer, similar to the first embodiment, also functions as the anode of the microdischarge devices. A dielectric layer 511, preferably made of $SiO_2$, is then fabricated as a continuous film covering the whole array area. This dielectric layer 511 is of uniform thickness and is UV light transparent. Inside the hollow cathode region 506, a discharge gas, or filler gas 507 is confined therein, as shown in FIG. 5b. The filler gas can be xenon, nitrogen, neon, argon, or other dischargable gases with a emitting light wavelength below 468 nm. The pressure of the discharge gas 507 inside the hollow cathode is typically from 100 to 1000 Torr for hollow cathode diameter in between 100 to 10 μm respectively. A conductive supporting element 512 can also be used at the back of the substrate 504, making electrical connections from the cathode or the substrate 504 to the negative side of a power supply 520. The positive side of the power supply 520 is electrically connected to the anode layer 510. In this case, alternating voltage from 60 cycles/second to radio frequency can also be used to activate the discharge.

Figure 6:
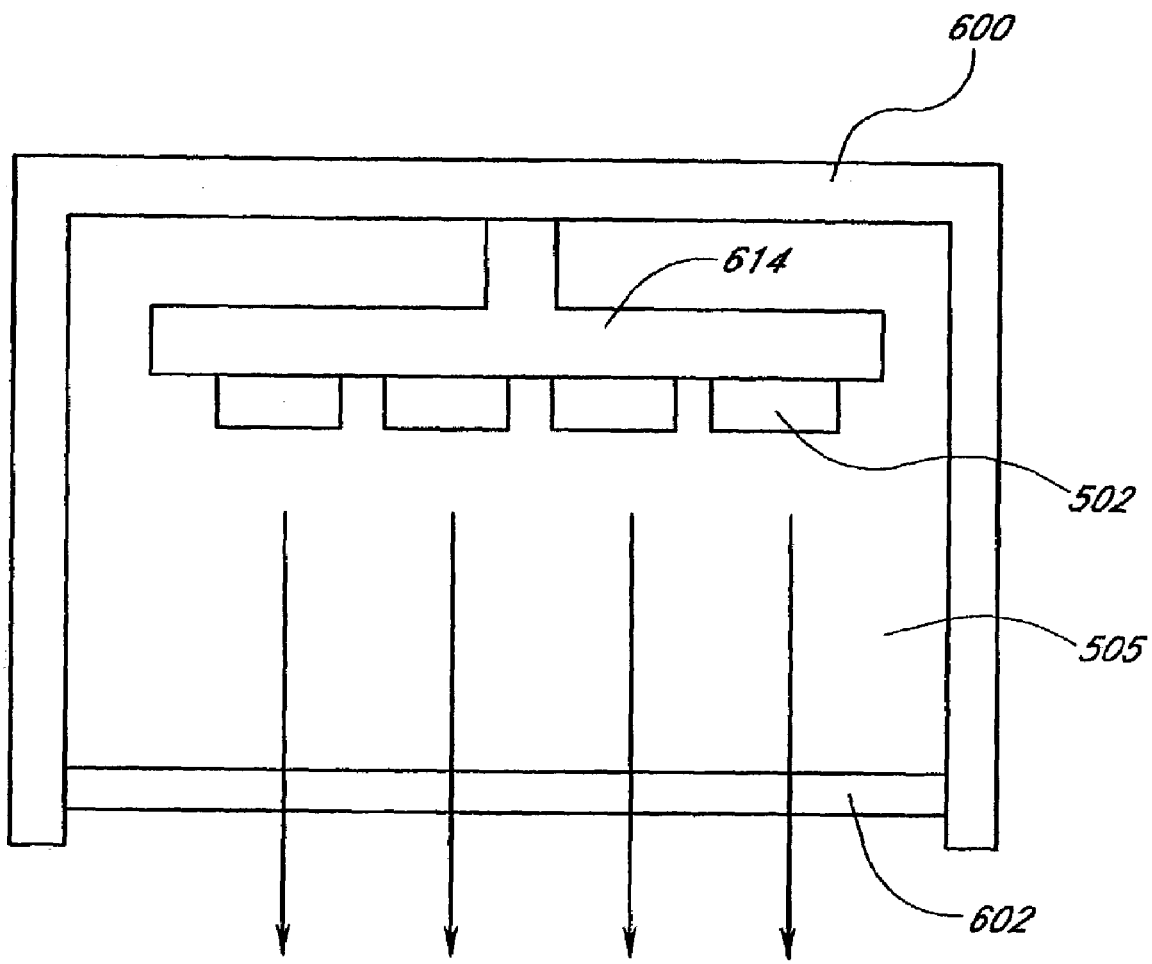
FIG. 6 illustrates a high intensity UV light source of the present invention, where a plurality of arrays of microdischarge devices are assembled together to increase radiation area.

FIG. 6 shows an assembly of a planar high intensity UV light source 402 which is made of at least one array 502 of the microdischarge devices. This UV light source has a shell 600 with a front face piece 602 which is made of a UV transparent material. The shell 600 with the front face piece 602 has a capability of confining discharge gases, as well as holding a vacuum therein. The dimension of the UV light illuminating area is preferably larger than that of the copper oxide which is to be photoreduced.

In order to increase the area of UV light illumination for photoreducing copper oxide on semiconductor wafers, the high intensity UV light source is made by assembling several arrays 502 together on top of a conductive supporting piece 614 which is mounted inside of the shell 600. The supporting piece 614 can even take the place of the supporting element 512 in both of the two embodiments described above. A single power supply can be used to supply electrical power to the microdischarge devices by connecting with the cathodes and anodes. In this case, the cathodes are all connected by mounting the arrays onto the supporting piece 614, with the substrates in contact with the supporting piece 614 and the side which involves the anodes facing away from the supporting piece 614.

When the arrays 502 have the structure of the first embodiment as described above, there is a need for filling a discharge gas within the shell 600. The discharge gas can be xenon, nitrogen, or other dischargable gases with a wavelength below 468 nm. The pressure of the discharge gas inside the shell 600 is typically from 100 to 1000 Torr.

When the arrays 502 have the structure of the second embodiment as described above, the discharge gas is already confined within the hollow cathode area, and there is thus no need for filling gas inside the shell 600. The front face piece 602 can be optionally eliminated to increase the transmitting efficiency of the UV light.

Figure 7A:
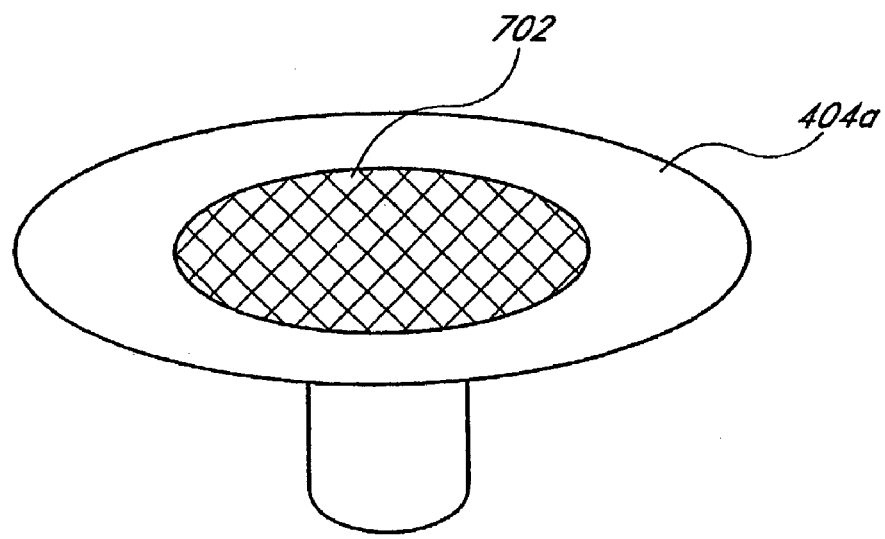
FIGS. 7a–7b illustrate two embodiments of a wafer holder which can be used for holding a single wafer, or for holding a plurality of wafers thereon.
Figure 7B:
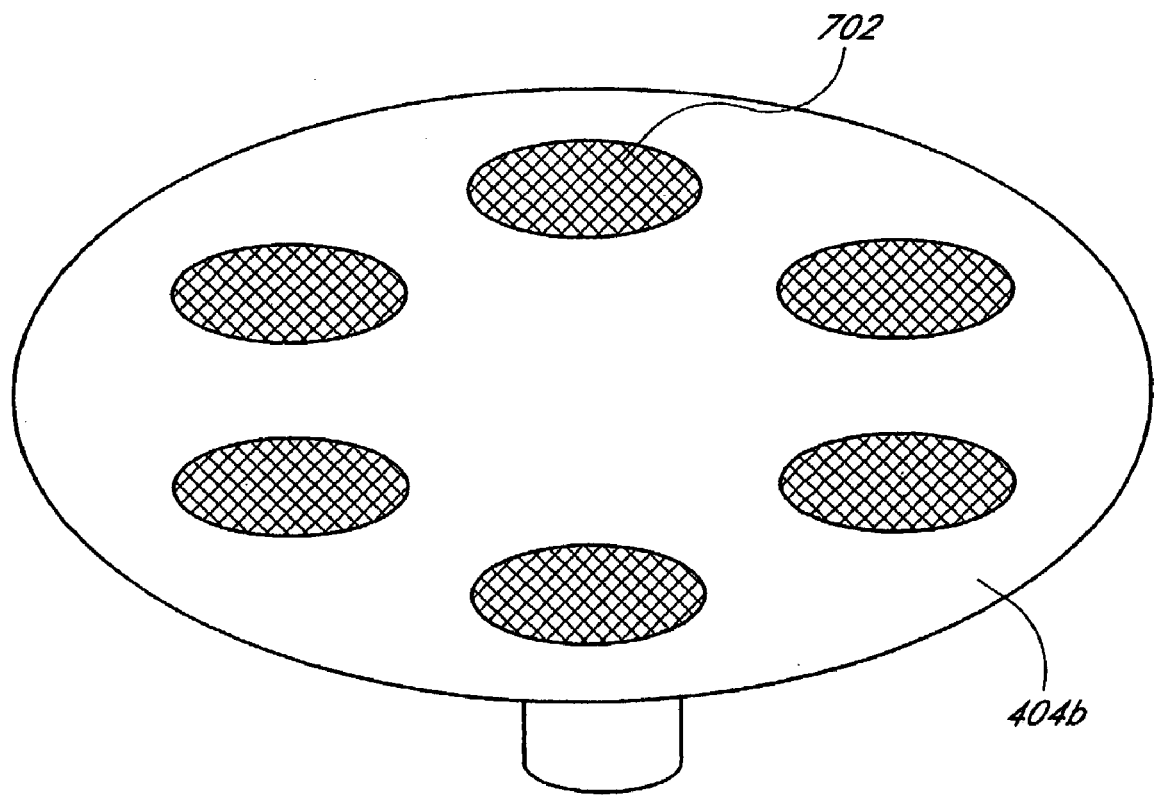

The wafer holder 404 in the photoreduction apparatus of FIG. 4 has two preferred embodiments which are illustrated herein in FIG. 7a and FIG. 7b. One embodiment of the wafer holder is designed for holding one single wafer, as illustrated in FIG. 7a, and the other embodiment of the wafer holder is designed for holding multiple wafers as shown in FIG. 7b. During the photoreduction process, a semiconductor wafer or wafers 702 with copper oxide layers thereon are placed on the wafer holder 404a or 404b with the backside of the wafer in contact with the wafer holder while the side which involves copper oxide facing away from the wafer holder. It is preferred, as shown in FIG. 4, that the wafer holder be positioned at the bottom, inside the reaction chamber of the photoreduction apparatus, and the high intensity UV light source be mounted at the top with the UV light emitting side facing down. In this configuration, the semiconductor wafers 702 would be placed on the wafer holders 404a or 404b with the side which includes copper oxide facing up. There is also means, such as vacuum, to keep the wafers stable on the holders during the photoreduction process. Both of the wafer holders 404a and 404b can be optionally rotating during the photoreduction process to increase the uniformity of the copper oxide removal process.

Figure 8A:
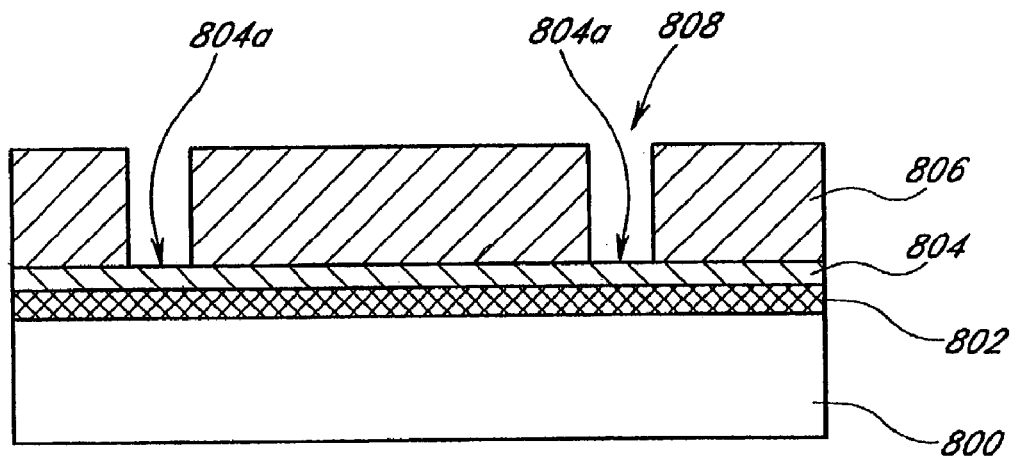
FIGS. 8a–8c illustrate cross sections of a silicon wafer at different process steps of fabricating an inter-layer contact, where photoreduction is used to remove the copper oxides.
Figure 8B:
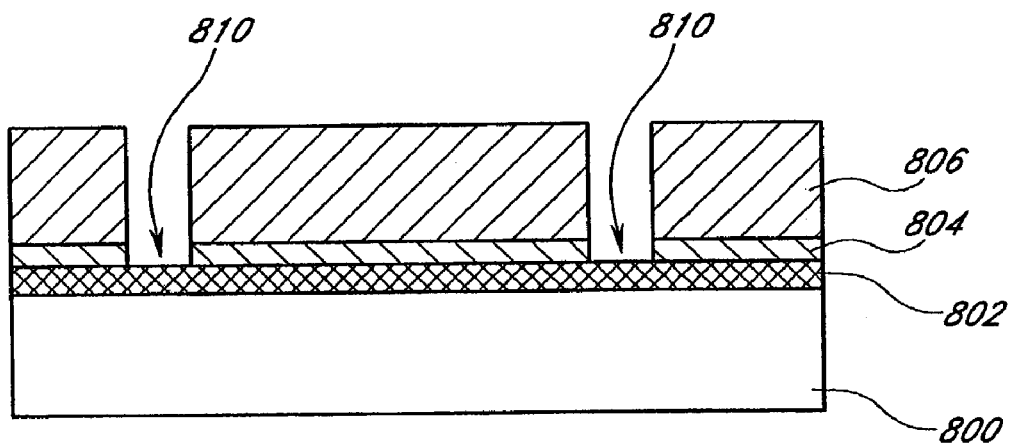
Figure 8C:
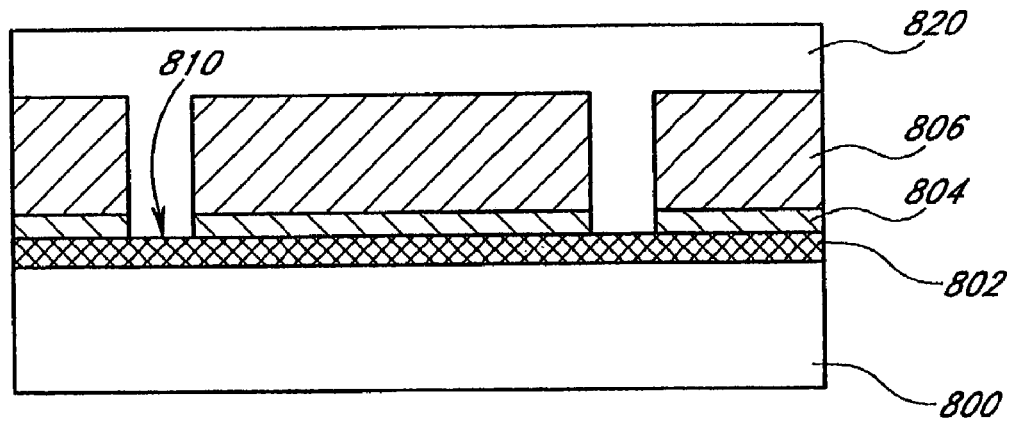

In order to explain the process of copper oxide photoreduction on a semiconductor wafer which has interconnect structures thereon, FIGS. 8a to 8c are used to illustrate the process by using cross section views of the wafer.

As shown in FIG. 8a, a semiconductor wafer with a metallic copper layer 802 is deposited on a wafer substrate 800, where, as shown, the copper layer 802 is oxidized to form a layer of $Cu_2O$ or CuO 804 due to exposure to the air. A dielectric layer 806 is deposited and defined on top of the wafer to form contact openings 808 by photolithography and etching technology. The exposed portion of the copper oxide 804a at the bottom of the contact holes 808 needs to be removed or reduced to metallic copper in order to make a low resistance connection with a subsequent copper layer. As shown in FIG. 8b, after illumination by strong UV light 812 onto the wafer for a period of time (the time needed for a complete photoreduction depends on the intensity and wavelength of the UV light), the oxide 804a is reduced to metallic copper 810. A subsequent copper layer 820, as shown in FIG. 8c, is deposited on top of the dielectric 806 and into the contact openings 808, making a connection with the first copper layer 802.

To prevent the copper surface from further oxidation before the second copper layer is deposited, it is advantageous to combine the reaction chamber of the present invention with a copper deposition process tool, so that the second copper layer can be deposited without exposing the wafer to an oxygen environment.

Although the foregoing invention has been described in terms of certain preferred embodiments, other embodiments will be apparent to those of ordinary skill in the art. Additionally, other combinations, omissions, substitutions and modifications will be apparent to the skilled artisan, in view of the disclosure herein. Accordingly, the present invention is not intended to be limited by the recitation of the preferred embodiments, but is instead to be defined by reference to the appended claims.

We claim:

1. A method of processing a semiconductor wafer, comprising:
   placing the semiconductor wafer on a wafer holder inside a reaction chamber, a top surface of the semiconductor wafer comprising a copper oxide layer;
   flowing a non-oxidizing gas into the chamber; and
   converting the copper oxide layer into a metallic copper layer by photoreducing the copper oxide layer by illuminating the copper oxide layer with a high intensity UV light from a high intensity planar UV lamp made of at least one array of microdischarge devices.

2. The method of claim 1, further comprising rotating the wafer holder to increase process uniformity.

3. The method of claim 1, wherein the reaction chamber is designed to process a single wafer at a time.

4. The method of claim 1, wherein the non-oxidizing gas is selected from the group consisting of nitrogen, neon, hydrogen and ammonia.

5. The method of claim 1, wherein the non-oxidizing gas has a pressure in the range of 100 Torr to 1000 Torr.

6. The method of claim 1, wherein the UV light has a wavelength shorter than 468 nm.

7. The method of claim 1, wherein the UV light has an intensity in the range of 1 $W/cm^2$ to 100 $W/cm^2$.

8. The method of claim 1, further comprising: depositing a subsequent conductive layer to make a direct contact with the copper layer without exposing the semiconductor wafer to an oxidizing environment.

9. The method of claim 8, further comprising rotating the wafer holder to increase process uniformity.

10. The method of claim 8, wherein the non-oxidizing gas is selected from the group consisting of nitrogen, neon, hydrogen and ammonia.

11. The method of claim 8, wherein the non-oxidizing gas has a pressure in the range of 100 Torr to 1000 Torr.

12. The method of claim 8, wherein the wavelength of the UV light is shorter than 468 nm.

13. The method of claim 1, wherein the UV lamp illuminates a surface area greater than the wafer.

14. The method of claim 1, wherein the UV light has an intensity exceeding 50 $W/cm^2$.

15. The method of claim 1, wherein the UV light has a wavelength from 100 nm to 400 nm.

16. The method of claim 1, wherein the microdischarge devices each comprise a hollow cathode having a diameter between 100 μm and 10 μm.

* * * * *